United States Patent
Coppola

[19]

[11] Patent Number: 6,020,783
[45] Date of Patent: Feb. 1, 2000

[54] RF NOTCH FILTER HAVING MULTIPLE NOTCH AND VARIABLE NOTCH FREQUENCY CHARACTERISTICS

[75] Inventor: Theodore A. Coppola, Marlborough, Mass.

[73] Assignee: Signal Technology Corporation, Danvers, Mass.

[21] Appl. No.: 09/092,531

[22] Filed: Jun. 5, 1998

[51] Int. Cl.[7] .................................................. H03K 5/00
[52] U.S. Cl. ........................................ 327/556; 327/552
[58] Field of Search .................... 327/552, 556; 342/128

[56] References Cited

U.S. PATENT DOCUMENTS

| | | | |
|---|---|---|---|
| 3,659,212 | 4/1972 | Saliga | 327/556 |
| 4,088,834 | 5/1978 | Thurmond | 179/1 |
| 4,602,337 | 7/1986 | Cox | 364/480 |
| 4,662,001 | 4/1987 | Cruz et al. | 455/340 |
| 5,054,117 | 10/1991 | Cruz et al. | 455/189 |
| 5,337,056 | 8/1994 | Dax | 342/128 |

*Primary Examiner*—Dinh T. Le
*Attorney, Agent, or Firm*—George A. Herbster; Pearson & Pearson

[57] ABSTRACT

A filter network having the capability of establishing multiple, tunable notch frequencies. A notch filter path is established for each notch frequency and includes a bandpass filter and inverter. An input RF signal covering a wide frequency range is applied to all the notch filter paths. Each notch filter path produces an output spectrum that is equal in magnitude and 180° out of phase with respect to an undesired frequency spectrum. A combiner circuit combines the outputs of each notch filter path in parallel with the RF input signal to produce an RF output signal with all desired spectra unchanged and all undesired spectra attenuated.

20 Claims, 7 Drawing Sheets

RF NOTCH FILTER HAVING MULTIPLE NOTCH AND VARIABLE NOTCH FREQUENCY CHARACTERISTICS

BACKGROUND OF THE INVENTION

1. Field of the Invention

This invention generally relates to notch filters and more particularly to notch filters that have the capability of providing multiple notches in which each notch can be fixed or variable.

2. Description of Related Art

Notch filters have use in a wide variety of applications. They are particularly useful in RF applications for enhancing the reception of a weak signal or desired frequency spectrum by attenuating or rejecting a strong adjacent interfering signal or undesired frequency spectrum. If an application is characterized by a single undesired frequency spectrum, a notch filter designed for that frequency spectrum is placed in series with the signal path. However, there are a number of applications in which attenuation of two or more interfering signals is required.

In accordance with a widely accepted approach, a filter network comprises a notch filter for each notch frequency. The network cascades the individual notch filters. Thus, in theory an incoming spectra passes through each of these notch filters with each notch filter attenuating its corresponding frequency spectrum. However, the desired signals in the spectra also degrade as they pass through the successive notch filters. For example, assume an incoming spectra has the following signal spectra:

$$F_{SPECTRA} = m_1, f_1 + m_2, f_2 + m_3, f_3 + \ldots + m_x, f_x$$

where each m represents the magnitude and each f represents the center or nominal frequency of a frequency spectrum. Using conventional filter analyses, the series representation for each of three notch filters would be:

$$F_{NOTCHA} = a_1, f_1 + a_2, f_2 + a_3, f + \ldots + 0, f_{NOTCHA} + \ldots a_x, f_x$$

$$F_{NOTCHB} = b_1, f_1 + b_2, f_2 + b_3, f + \ldots + 0, f_{NOTCHB} + \ldots b_x, f_x$$

$$F_{NOTCHC} = c_1, f_1 + c_2, f_2 + c_3, f + \ldots + 0, f_{NOTCHC} + \ldots c_x, f_x$$

wherein the coefficients a, b, c, ... represent a transfer or multiplying function of each frequency component.

In a practical sense, these coefficients represent distortion and noise degradation that appears in signals at frequencies outside the undesired frequency spectra. That is, for two notch filters the output of a cascaded network will be:

$$F_{OUTPUT} = F_{SPECTRA} * F_{NOTCHA} * F_{NOTCHB}$$

or $$F_{OUTPUT} = a_1 b_1 m_1 f_1 + a_2 b_2 m_2, f_2 + \ldots + 0, f_{NOTCHA} + 0, F_{NOTCHB} + \ldots + a_x b_x m_x f_x$$

In this representation the magnitude of a frequency spectrum at a corresponding notch is "0" indicating those signals are rejected or attenuated. The remaining frequency components, however, have been degraded by the coefficients a and b. Thus it is desirable to provide some filter network that can eliminate this signal degradation of desired spectra, particularly for applications in the radio frequency range.

In some applications it can be assumed that each interfering signal has a fixed frequency. In other situations it may be necessary to adjust the notch frequency (i.e., the frequency of a frequency spectra to be attenuated). Several approaches have been suggested for accommodating multiple notches and variable frequency notches.

One approach for eliminating feedback in different and variable audio bands with multiple notch filters is disclosed in U.S. Pat. No. 4,088,834 (1978) to Thurmond. An input signal in the audio range is applied to a circuit junction that acts as a summing circuit with signals from each of a plurality of parallel, active notch filters. A first amplifier in each notch filter produces a filter output signal that is opposite in phase to the input signal. The filter output signals from all the notch filters are then applied to the summing junction at an input capacitor. The use of active filters in this application introduces a number of complexities and increases costs. Moreover, although a frequency variation is possible, the disclosed variable frequency control establishes frequency ranges and frequency adjustments. That is, the time constants for each of the plurality of RC time constant circuits must be varied thereby varying characteristics of the overall notch filter. The limitations imposed by these two characteristics therefore limits the application of the disclosed approach to signals having frequencies in the audio range.

U.S. Pat. No. 5,337,756 (1994) to Dax discloses a dynamically tunable notch filter useful in the 500 kHz to 50 MHz RF band for attenuating narcissus signals present in an electrical signal from a laser radar system. A bandpass filter, constituted by a high and low pass filters in cascade, and an amplifier connect between quadrature phase shift mixers in each of two parallel paths. As a result the RF signal is split into the two paths, modulated, passed through the bandpass filter, demodulated and combined to produce an output signal in which any narcissus signals are attenuated. Thus while the Dax patent discloses a dynamically tunable notch filter, the filter appears limited to a single notch frequency.

Therefore a need exists for a notch filter network or circuit that can handle multiple undesired frequency spectra without degrading any desired spectra. Moreover there continues to be a need for a multiple notch filter in which each notch filter can be tuned to a specific spectrum and in which each of the notch filters operates with maximum efficiency over a wide frequency range.

SUMMARY

Therefore it is an object of this invention to provide an improved notch filter for attenuating different frequency spectra.

Another object of this invention is to provide notch filter network for a signal having a frequency spectrum in which multiple undesired frequency spectra are attenuated with only minimum insertion loss, improved noise attenuation and improved performance.

Still another object of this invention is to provide a notch filter network in which the operation can be matched to different undesired frequency spectra.

Yet another object of this invention is to provide a notch frequency filter that operates over a wide frequency range with optimal performance.

In accordance with one aspect of this invention a notch filter receives an input signal including desired and undesired frequency spectra. A bandpass filter means has a center frequency at the center frequency of an undesired spectrum. An inverter receives the output from the bandpass filter, and a single combiner combines the input signal with its desired and undesired frequency spectra and the output from the inverter to produce an output signal in which the undesired spectrum is attenuated.

In accordance with another aspect of this invention a multiple notch filter network attenuates multiple undesired spectra. The notch filter comprises a notch filter path for each undesired spectra. Each notch filter path includes a bandpass filter having a center frequency corresponding to the frequency of a passband corresponding to the width of an undesired spectrum. An inverter receives the output from the bandpass filter. A signal divider couples the input signal to each of the notch filter paths in parallel. A signal combiner combines the input signal with its desired and undesired frequency spectrum and the outputs from each notch filter path thereby to produce an output signal in which each spectrum is attenuated.

In accordance with another aspect of this invention a multiple notch filter circuit attenuates signals in different undesired RF spectra. The notch filter includes an input terminal circuit for receiving the incoming RF signal including the desired and undesired RF spectra. A filter path for each undesired spectrum connects to the input terminal and includes a passive RF bandpass filter at one of the different frequencies for receiving the input signal. An inverter shifts the phase of the bandpass filter output by substantially 180°. A combiner connects to the output terminal for receiving signals from the input terminal and each of the notch filter paths in parallel thereby to produce the filtered output at the output terminal.

In accordance with still another aspect of this invention, a variable frequency notch filter matches to any undesired spectrum. The notch filter includes a band pass filter having a fixed center frequency and a passband that corresponds to the width of the undesired spectrum. A first mixer combines the input signal and a signal from a variable frequency local oscillator thereby to translate the undesired spectrum into the passband of the bandpass filter. An inverter receives the output from the bandpass filter. A second mixer combines the frequency from the inverter and the local oscillator frequency thereby to translate the inverted spectrum from the bandpass filter to the frequency of the undesired spectrum. A signal combiner combines the input signal and output from the second mixer to produce an output signal in which the undesired spectrum is attenuated.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENT

Figure 1:
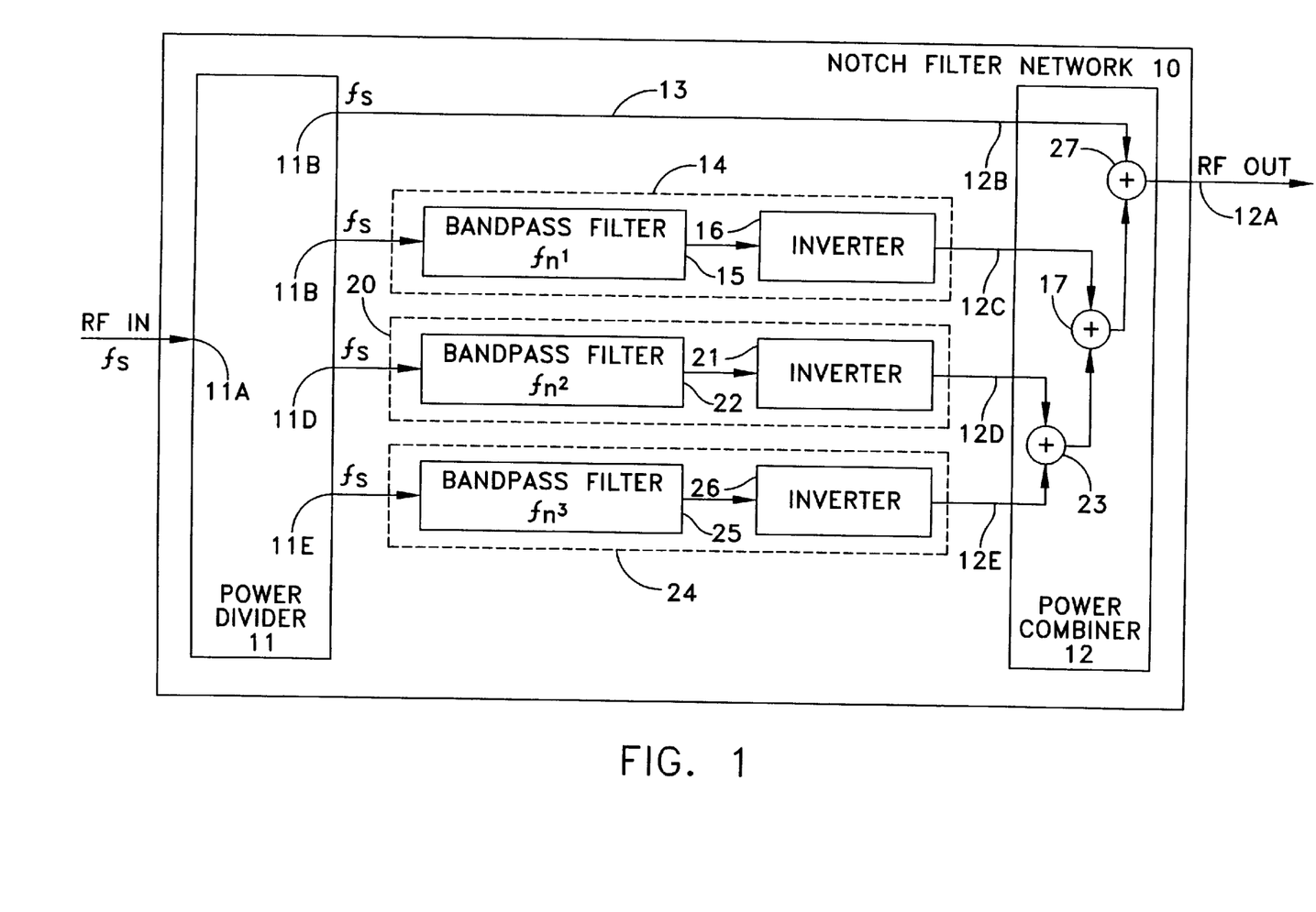
FIG. 1 depicts a multiple frequency notch filter network constructed in accordance with this invention.
Figure 2A:
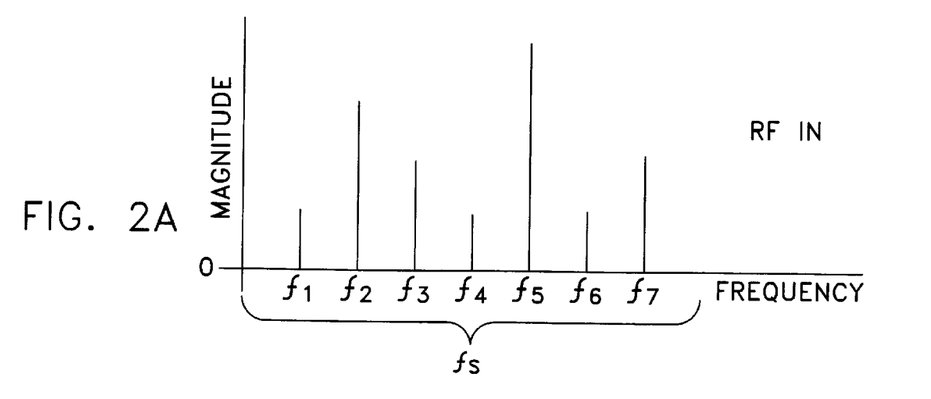
FIGS. 2A through 2C depict the operation of the filter network of FIG. 1.

FIG. 1 depicts a notch filter network 10 that receives a signal RF IN that covers a frequency spectrum $f_s$ in FIG. 2A as comprising spectra in $f_1$ through $f_7$ frequency bands. For purposes of explanation it is assumed that $f_1$, $f_3$, $f_3$ and $f_4$ spectra constitute "desired spectral" while the $f_2$, $f_5$, and $f_7$ spectra constituted "undesired spectra".

A broad band power divider 11 receives the total RF IN signal at an input 11A. The power divider 11 then divides that signal to multiple equal-strength signals at multiple outputs. Four outputs, designated 11B through 11E are disclosed. The structure, function and operation of power dividers, such as power divider 11, are well known in the art. Further, it is known that the number of outputs can vary, four outputs being shown for purposes of explanation only.

The notch filter network 10 also includes a power combiner 12 that combines multiple RF signals to produce an RF OUT signal at terminal 12A. A power combiner essentially comprises a plurality of two-input summing circuits that will combine input signals at terminals 12B through 12E, two at a time, to produce an output signal. The structure, function and operation of power combiners, such as the power combiner 12, are well known in the art. As will also become apparent the number of inputs to the power combiner 12 is arbitrary; in this case there are four inputs.

The notch filter network 10 attenuates the undesired $f_2,f_5$ and $f_7$ spectra by establishing a first direct path 13 from the output 11B if the power divider 11 to an input terminal 12B of the power combiner 12. This path is assumed to introduce no phase or amplitude shifts in the spectrum $f_s$.

A second, or notch filter path 14 includes a bandpass filter 15 having a center frequency at one desired notch filter frequency $f_{n1}$ and a passband corresponding in width to the width of an undesired spectrum. Selecting a passband is well within the skill of persons familiar with the electronic filter art. An inverter couples the output of the bandpass filter 15 to one port of a summing junction 17 in the power combiner 12. Assuming that the center frequency of the bandpass filter corresponds to the $f_2$ frequency (i.e, $f_{n1}=f_2$), the output of the inverter 16 will be a spectrum that is 180° out of phase with respect to and equal in amplitude to the $f_2$ spectrum.

Likewise a second notch filter path 20 has a similar structure with a bandpass filter 21 and inverter 22 for conveying an output to a summing junction 23 in the power combiner 12. In this path the center frequency for the bandpass filter 21 is $f_{n2}$ and is set to another notch frequency such as the $f_5$ spectrum (i.e., $f_{n2}=f_5$). Thus the notch filter path 20 produces a signal at input terminal 12D of the power combiner 12 with a spectrum that is equal in amplitude to and 180° out of phase with respect to the $f_5$ spectrum.

A third notch filter path for the $f_7$ frequency component includes a bandpass filter 25 and inverter 26 with the center frequency, $f_{n3}$, of the bandpass filter 25 being set to $f_7$. Consequently the signal at input 12E is a spectrum that is equal in amplitude to and 180° out of phase with the $f_7$ spectrum.

Summing junction 23 combines the spectrum from the notch filter paths 20 and 24. Summing junction 17 then combines the output of the summing junction 23 and the output of the notch filter path 14. The signal from the output of the summing junction 17 to one input of a summing junction 27 is characterized by frequency spectra that mirrors the undesired frequency spectra.

Figure 2B:
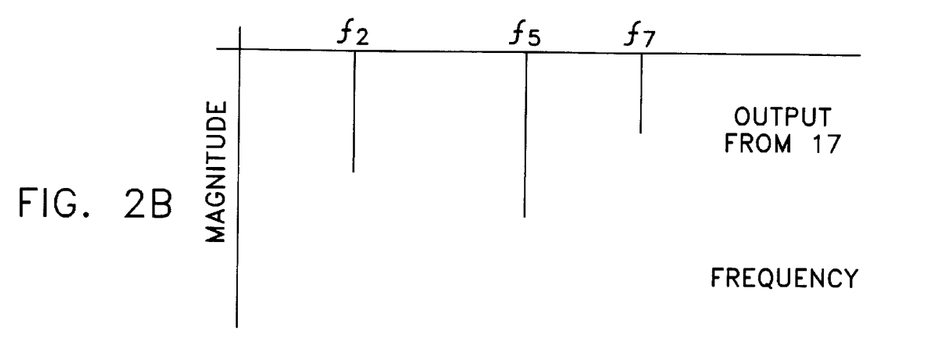

FIG. 2B illustrates this output. In FIG. 2B each of the $f_2$, $f_5$ and $f_7$ mirrored spectra have a magnitude equal to but opposite from the magnitude to the corresponding undesired spectra shown in FIG. 2A. Consequently when the spectra represented by FIG. 2A and the spectra represent by FIG. 2B are combined, the $f_2$, $f_5$ and $f_7$ spectra are cancelled and the RF OUT spectra includes only the desired $f_1$, $f_3$, $f_4$ and $f_6$ frequency spectra.

Stated differently, a bandpass filter is the dual of a notch filter and has a transfer series for a full spectrum as follows:

$$F_{BANDPASSA} = 0, f_1 + 0, f_2 + \ldots + a, f_{BANDPASSA} + \ldots + 0, f_x.$$

Applying this general equation to the specific example in FIG. 1, the transfer series for each of the notch paths 14, 20 and 24 are given by:

$$F_{BANDPASS\_15} = 0, f_1 + a, f_{BANDPASS\_15} + 0 f3, +0, f4 + 0, f_5 + 0, f_6 + 0, f_7$$

$$F_{BANDPASS\_21} = 0, f_1 + 0, f_2 + 0, f3, +0, f4 + b, f_{BANDPASS\_21} + 0, f_6 + 0, f_7$$

$$F_{BANDPASS\_25} = 0, f_1 + 0, f_2 + 0, f3, +0, f4 + 0, f_5 + 0, f_6 + c, f_{BANDPASS\_25}$$

Each of the inverters 16, 22 and 26 "inverts" the magnitude of the input (i.e., multiplies the input by −1). The transfer series for each of the inverters then is:

$$F_{INVERTER} = -1, f_1 + -1, f_2 + \ldots + -1, f_x$$

Consequently the output from each of the inverter paths 14, 20 and 24 is given by:

$$F_{14} = 0, f_1 - a, f_{BANDPASS\_15} - 0, f_3 - 0, f_4 - 0, f_5 - 0, f_6 - 0, f_7$$

$$F_{20} = 0, f_1 - 0, f_2 - 0, f_3 - 0, f_4 - b, f_{BANDPASS\_21} - 0, f_6 - 0, f_7$$

$$F_{24} = 0, f_1 - 0, f_2 - 0, f_3 - 0, f_4 - 0, f_5 - 0, f_6 - c, f_{BANDPASS\_25}$$

When these signals are applied to the combining circuit 12 along with the RF IN signal, the RF OUT signal has the following spectra:

$$RF\ OUT = m_1, f_1 + m_2, f_{BANDPASS\_15} - am_2,$$

$$f_{BANDPASS\_15} + m_3, f_3 + m_4, f_4 + m_5, f_{BANDPASS\_21} - bm_5,$$

$$f_{BANDPASS\_21} + m_6, f_6 + m_7, f_{BANDPASS\_25} - cm_7, f_{BANDPASS\_25}$$

In the foregoing equation, only the frequencies to be attenuated are affected by the a, b and c coefficients. The notch filter network 10 does not affect the remaining, desired, $f_1$, $f_3$, $f_4$, and $f_6$ spectra. If the coefficients are nearly unity (i.e., a=b=c=1), then the foregoing equation resolves to:

$$RF\ OUT = m_1, f_1 + m_3, f_3 + m_4, f_4 + m_6, f_6.$$

Figure 2C:
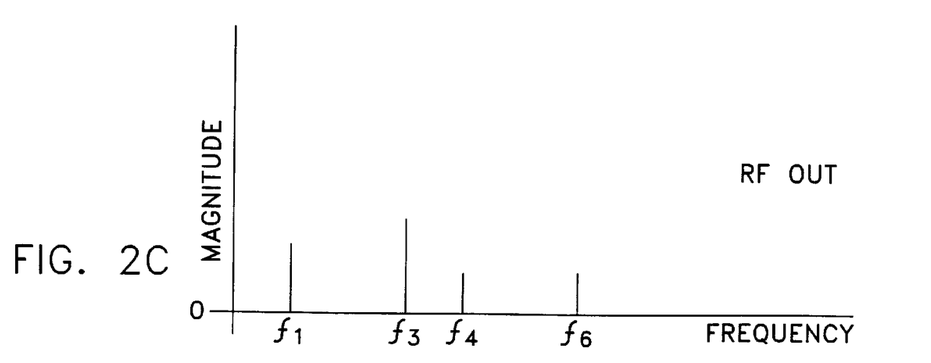

Thus each notch filter path constructed in accordance with this invention cancels an undesired frequency spectrum without affecting the desired frequency spectra. While FIG. 2C depicts this result showing only the $f_1$, $f_3$, $f_4$, and $f_6$ desired frequency spectra in the RF OUT signal from the combiner circuit 12 in FIG. 1, a filter network constructed in accordance with this invention is insensitive to the number of notch frequencies included in the notch filter network.

The foregoing discussion explains the theory of operation of a notch filter circuit in accordance with this invention assuming that the transfer phase characteristic is static and at zero degrees. However, all filter structures obtain their transfer functions by pole manipulation, and this manipulation influences the phase response of the filter. To properly operate a filter constructed in accordance with this invention, it is necessary to limit each bandpass filter to a linear phase type of bandpass filter near its center frequency. The magnitude response of the bandpass filter must also be attenuated before reaching an inversion point for the filter (i.e., a phase shift of 180°). Gaussian and Bessel types of bandpass filters are examples of filters that satisfy these criteria.

Figure 3:
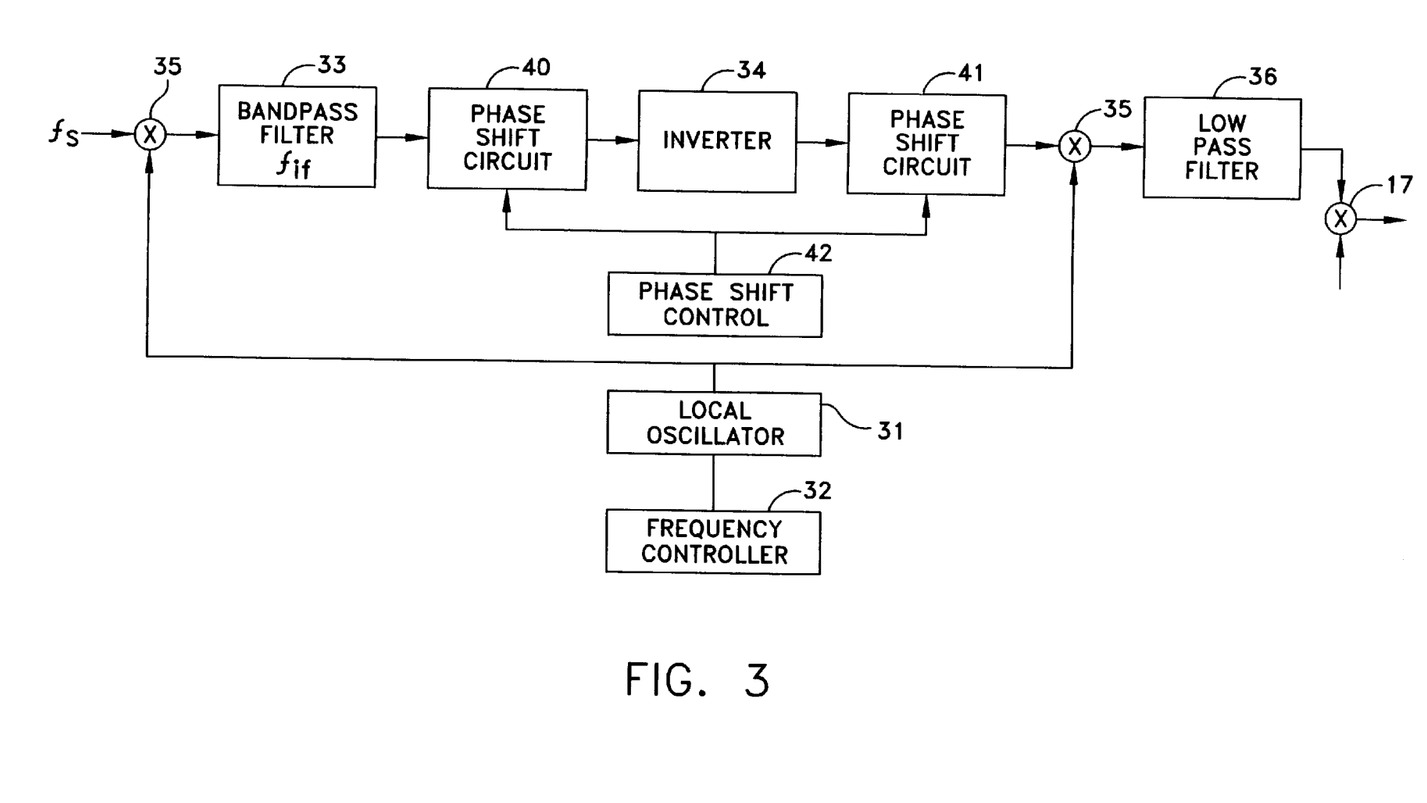
FIG. 3 depicts an embodiment of a notch filter path for providing a variable frequency notch filter and improved results.

In addition, the foregoing description assumes that each bandpass filter has a center frequency that corresponds to a notch frequency for an undesired frequency spectrum. In practice it is difficult to mass-produce notch filters if each bandpass filter must be designed to attenuate a particular spectrum. FIG. 3 also depicts a notch filter network in which the center frequency of the bandpass filter is constant, but adapted to provide a notch function at any frequency, either by manual adjustment or by automatic or computer controlled inputs.

More specifically, FIG. 3 depicts an embodiment of one of the notch filter paths, such as the notch filter path 14, that meets the criteria required to preserve the shape of the notch and further allows variation of the center or the notch frequency either by manual adjustment or dynamically. In this embodiment the notch filter path, designated by reference numeral 14A, receives the entire spectrum $f_s$, at a first mixer 30. A local oscillator 31 generates a signal at a frequency $f_{lo}$ established by a conventional frequency controller 32. The output from the mixer 30 to a bandpass filter 33 comprises two components. The first is the entire spectrum shifted up in frequency by the local oscillator 31; the other, the spectrum shifted own by the local oscillator frequency. The bandpass filter 33 has a fixed center frequency $f_{if}$ and the frequency controller 32 sets the local oscillator 31 such that:

$$f_{if} = f_n + f_{lo}.$$

In accordance with the embodiment depicted in FIG. 1, the notch filter path 14A additionally includes an inverter 34 so the inverted signal, modified by a phase shift circuit described later, passes to a second mixer 35, to be mixed with the output from the local oscillator 31. There are two outputs from the mixing circuit 35, namely:

$$f_{if} + f_{lo} \text{ and } f_{if} - f_{lo}.$$

A low pass filter 36 isolates the difference frequency by setting its cutoff frequency at the maximum frequency of the local oscillator 31. Consequently only the difference passes to the summing junction such as the summing circuit 24 shown in FIGS. 1 and 3, and this is:

$$f_{if} - f_{lo} = f_n + f_{lo} - f_{lo} = f_n$$

which is the notch frequency. Thus the circuit shown in FIG. 3 provides a variable notch frequency capability. This feature allows each bandpass filter to be constructed to the same center frequency, $f_{if}$, facilitating mass production of the notch filter path 14A and a filter network, such as the filter network 10 in FIG. 1.

Referring to FIG. 3, local oscillator 31 and frequency controller 32 are standard circuits. In one particular application in which the RF IN signal has a maximum of 30 MHz (i.e., 0≦fRF IN≦30 MHz), the local oscillator has a frequency range of 40 MHz≦$f_{lo}$≦70 MHz, so $f_{if}$=70 MHz.

Figure 4:
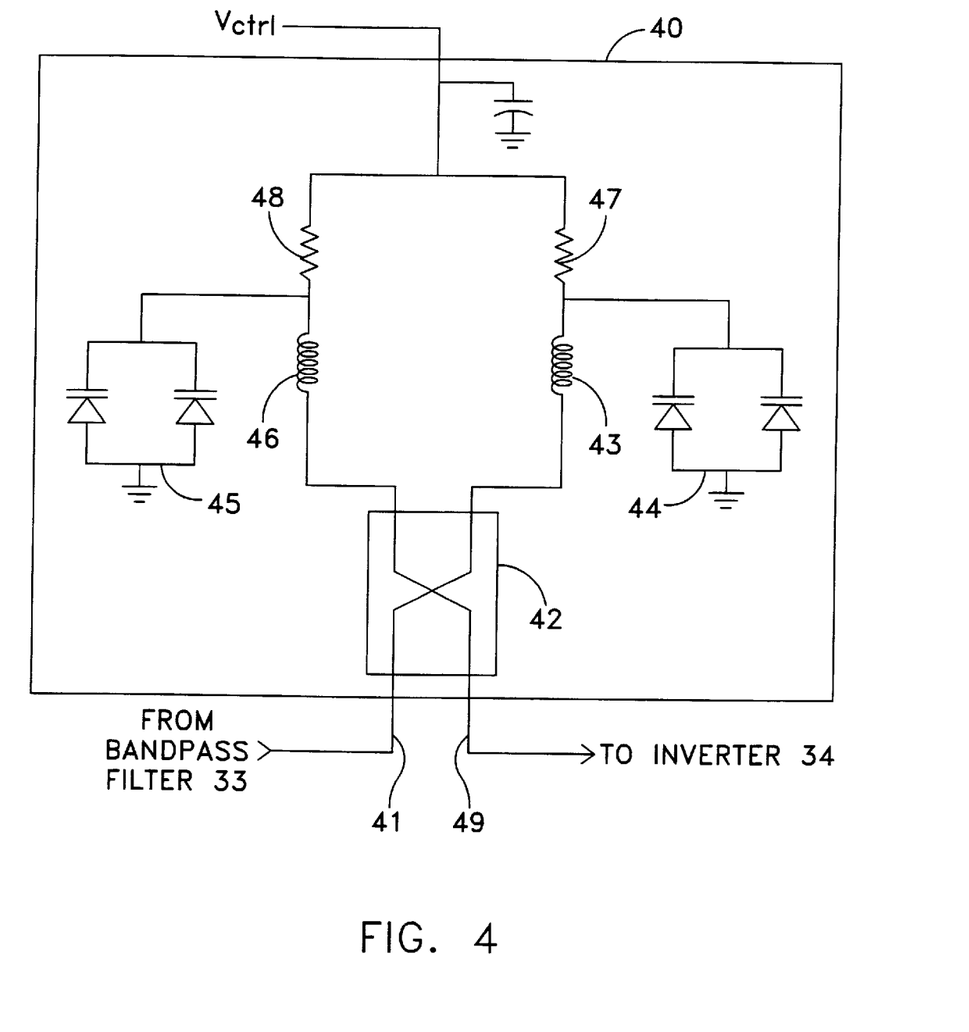
FIG. 4 depicts details of a phase shift circuit shown in FIG. 3.

Still referring to FIG. 3, the notch path 14A also provides necessary phase correction by means of two phase shift circuits 40 and 41 controlled by a phase shift control 42. Although any number of phase shift circuits could be utilized in the notch filter path 14A, a particularly well adapted approach uses a phase shifter employing a quadrature hybrid with tuned resonators on its ports as shown in detail in FIG. 4. Specifically in this quadrature hybrid-resonator, a quadrature hybrid 42 reflects the incoming signal from the bandpass filter 33 to each of two ports that attach to different resonators. One resonator comprises a fixed inductor 43 and a variable capacitor formed from parallel varactors 44. The other resonator comprises varactors 46 and an inductor 47. A $V_{ctrl}$ signal from the phase shift control 42 establishes the capacitance in each resonator and is applied through the resistors 47 and 48 to the varactors 44 and 45, respectively. Each resonator controls the energy reflected back through the quadrature hybrid 42 to an output 49. Hence, the phase shift circuits 40 and 41 provide a simple and efficient means for maintaining the 180° out-of-phase relationship between an undesired spectrum and the mirrored spectrum from a notch filter path.

The phase shift control 42 may be provided by a manual adjustment of the $V_{ctrl}$ signal. Alternatively the phase shift control 42 could include a table-driven control for the magnitude of the $V_{ctrl}$ signal based upon a table of stored values and frequencies. Other phase shift controls could also be used.

Figure 5A:
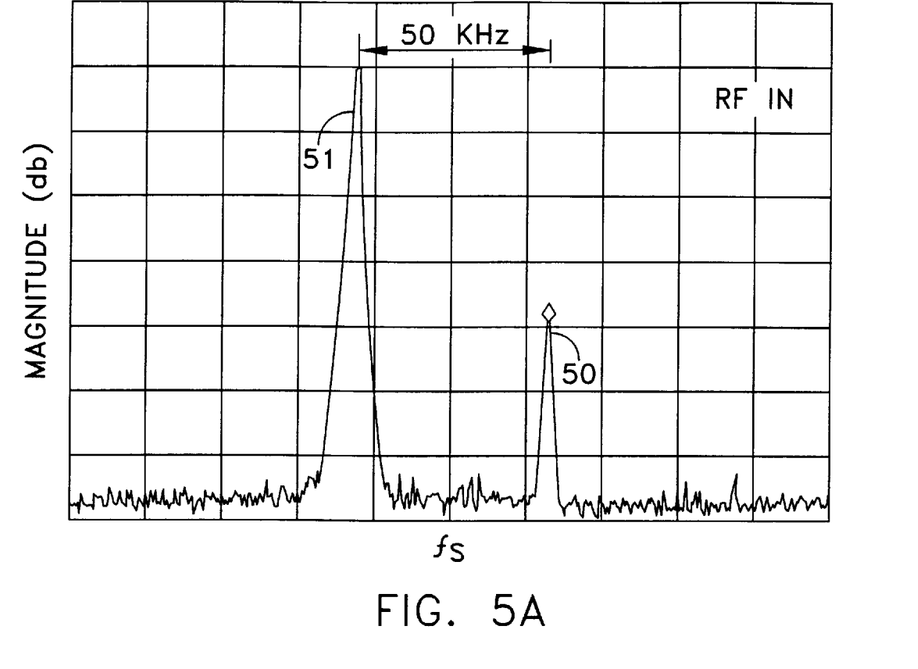
FIG. 5A depicts an input spectra with a desired and undesired frequency spectrum.
Figure 5B:
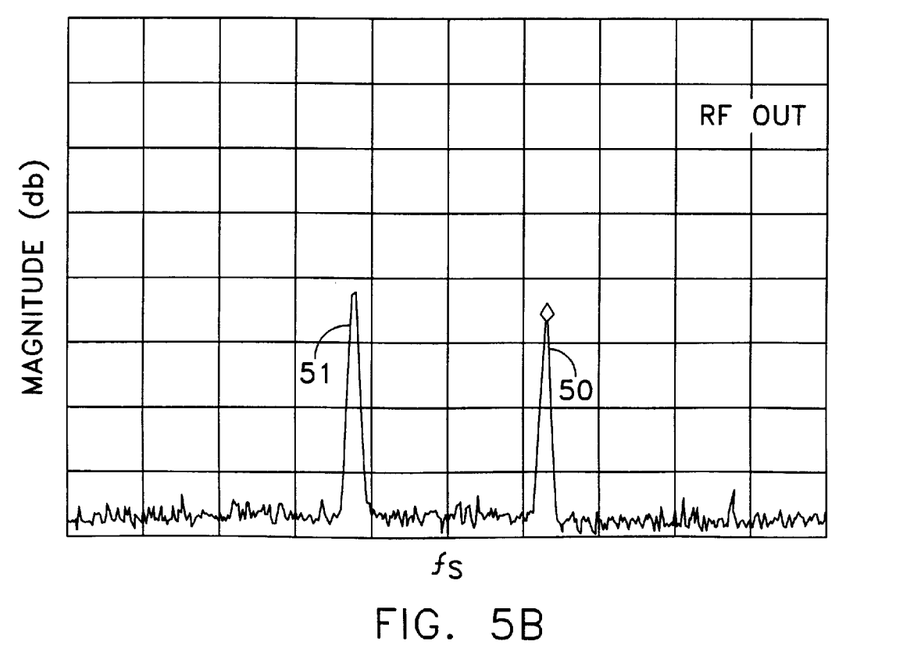
FIG. 5B depicts the output from a filter circuit constructed in accordance with FIGS. 1 and 3.

The effectiveness of a notch filter network is evidenced by a number of specific applications. For example, FIG. 5A depicts a desired 15 MHz frequency spectrum and a stronger undesired frequency spectrum 51 within 50 kHz of the desired spectrum 50. FIG. 5B depicts the desired spectrum 50 and the undesired spectrum 51 after filtering in a circuit as described with respect to FIGS. 1 and 3. The desired spectrum 50 remains unchanged, but the undesired spectrum 51 has been attenuated by 40 db. It is commonly accepted that any attenuation greater than 20 db is acceptable.

Figure 6A:
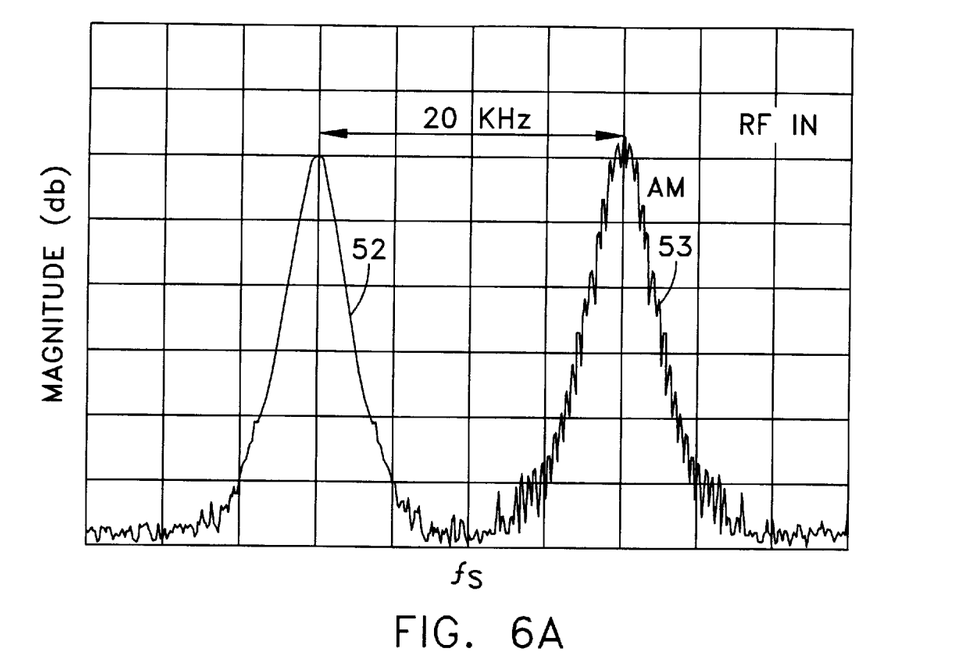
FIG. 6A depicts an input spectra with an undesired amplitude-modulated spectrum.
Figure 6B:
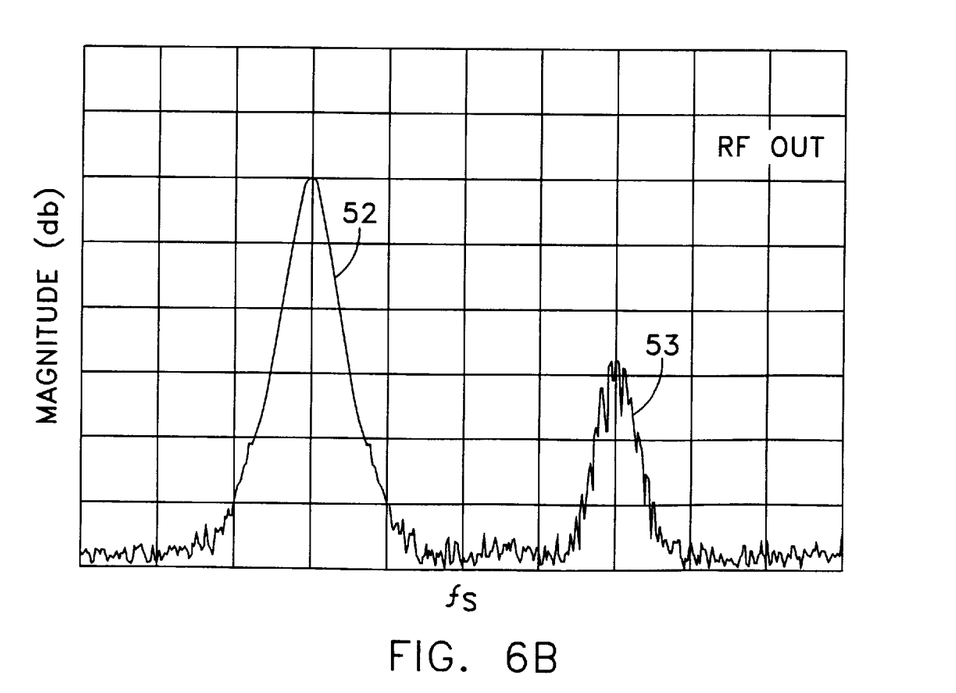
FIG. 6B depicts an output spectra from a filter circuit constructed in accordance with FIGS. 1 and 3.

FIGS. 6A depicts the results of another set of measurements in which a desired spectrum 52 at approximately 5 MHz is separated by 20 kHz from an undesired spectrum 53 characterized by amplitude modulation. After application to a filter constructed in accordance with FIGS. 1 and 3, the RF OUT signal has a spectrum as shown in FIG. 6B. The desired signal 52 remains unchanged. The amplitude modulated spectrum 53 is attenuated by 30 db.

Figure 7A:
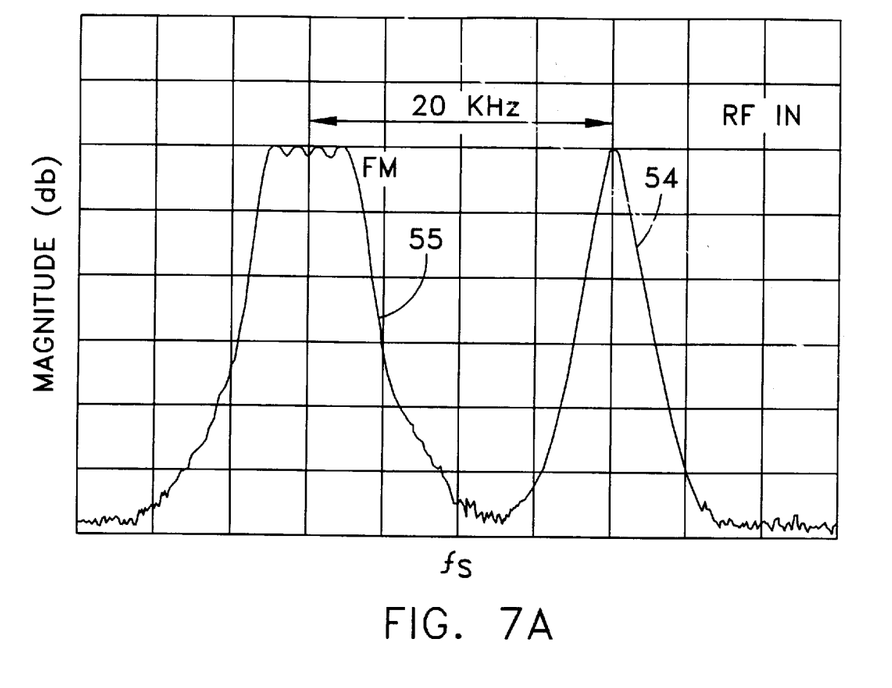
FIG. 7A depicts an input signal with a frequency spectra including an undesired frequency-modulated spectrum.
Figure 7B:
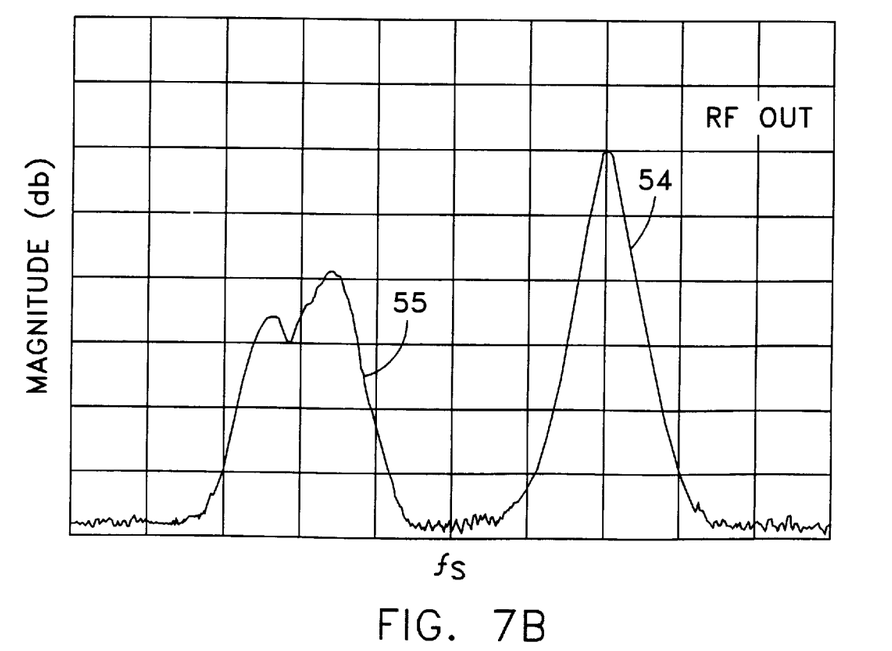
FIG. 7B depicts an output spectra from a filter circuit constructed in accordance with FIGS. 1 and 3.

Likewise, FIG. 7A depicts an RF input signal with a desired frequency spectrum 54 and an unwanted frequency spectrum 55 further characterized by being frequency modulated and separated from the desired spectrum 54 by 20 kHz. The RF OUT spectrum contains the desired spectrum 54 unchanged; the undesired spectrum 55 attenuated by 20 db.

Thus, in accordance with this invention a notch filter is provided for selectively attenuating one or more undesired spectra with minimum insertion loss and improved performance. Performance degradation, characteristic of prior art cascaded notch filters, is eliminated by placing each notch filter in a path parallel with other notch filters and with the full frequency spectra. This provides cancellation of any undesired spectrum. Moreover, the filter circuit shown, particularly the implementation in FIG. 3, provides a capability of varying each notch filter while still retaining a standard filter construction. This is provided by the use of the local oscillator and mixers and by the inclusion of the phase shift circuitry. Controls for the local oscillator and the phase shift circuit can also be standard devices. Control may be accomplished by means as simple as a potentiometer for establishing a different notch frequency for each notch filter or a variable signal in analog or digital form that can dynamically vary the notch frequency or the magnitude of phase shift for providing optimal performance over a wide range of frequencies.

This invention has been described with respect to a particular embodiment including passive Gaussian or Bessel bandpass filters having the characteristics of providing sufficient attenuation before reaching a ±180° phase shift and having linear phase shift through the center frequency. Specific phase shift circuits have been disclosed. It will be apparent that these phase shift circuits could be combined in a single position. Other phase shift circuitry could also be substituted for the specifically disclosed structures.

It also will be apparent that many modifications can be made to this specifically disclosed apparatus while still attaining some or all of the advantages of this invention. Therefore, it is the intent of the appended claims to cover all such variations and modifications as come within the true spirit and scope of this invention.

What is claimed as new and desired to be secured by Letters Patent of the United States is:

1. A notch filter for attenuating an undesired frequency spectrum in an input signal having desired frequency spectra, said notch filter comprising:

A) a passive bandpass filter means having a center frequency corresponding to the undesired frequency spectrum for receiving the input signal, B) an inverter that generates an inverted output from said bandpass filter, and C) a signal combiner for combining the input signal and the inverted output to produce an output signal in which that portion of the input signal in the undesired frequency spectrum is attenuated.

2. A notch filter as recited in claim 1 for operation with a variable frequency local oscillator wherein said bandpass filter means comprises:

i) a passive bandpass filter connected to said inverter having a passband at a constant center frequency, ii) a first frequency mixer for mixing the local oscillator frequency and the input signal for application to said bandpass filter at the center frequency, the local oscillator generating a frequency that translates the undesired frequency spectrum in the input signal to the passband of said bandpass filter, and iii) a second frequency mixer for mixing the local oscillator frequency with the inverted output for application to said combiner thereby to produce an output signal with the attenuated frequency spectrum being the undesired frequency spectrum.

3. A notch filter as recited in claim 2 wherein said inverter comprises a phase shift circuit that maintains the phase of the signal from said inverter at substantially 180° with respect to the phase of the signals having a frequency in the undesired frequency spectrum.

4. A notch filter as recited in claim 3 wherein the local oscillator has a maximum frequency and said second mixer generates sum and difference frequencies, said notch filter additionally comprising a low-pass filter intermediate said second mixer and said combiner having a cut off frequency greater than the frequency of the local oscillator.

5. A notch filter as recited in claim 1 wherein said inverter additionally comprises a phase shift circuit that maintains the phase of the signal from said inverter at substantially 180° with respect to the phase of signals having a frequency in the undesired spectrum.

6. A multiple frequency notch filter network for attenuating portions of a plurality of undesired frequency spectra centered at different frequencies, from an input signal having desired frequency spectra, said notch filter comprising:
   A) a notch filter path for each undesired frequency spectrum, each said notch filter path including:
      i) a passive bandpass filter means for receiving the input signal having a passband at a center frequency that corresponds to the center frequency of and a width corresponding to each undesired frequency spectrum, and
      ii) an inverter that generates an inverted output in response to the output from said bandpass filter,
   B) a signal divider for coupling the input signal to each of said notch filter paths in parallel, and
   C) a signal combiner for combining the input signal and the inverter outputs from said notch filter paths thereby to produce a filtered output signal in which each of the portions of the input signal corresponding to the undesired frequency spectra are attenuated without change to the input signal at the desired frequency spectra.

7. A multiple frequency notch filter network as recited in claim 6 wherein a said bandpass filter means for a given undesired spectrum comprises:
   i) a passive bandpass filter having a fixed center frequency and passband corresponding in width to the width of the corresponding undesired frequency spectrum,
   ii) a variable frequency local oscillator for generating a local oscillator signal,
   iii) a first frequency mixer for mixing the local oscillator frequency and the input signal to translate the undesired frequency to the passband of said bandpass filter, and
   iv) a second frequency mixer for mixing the local oscillator frequency with the output from said inverter thereby to produce an output frequency spectrum in which the undesired frequency spectrum is attenuated.

8. A multiple frequency notch filter network as recited in claim 7 wherein said inverter comprises a phase shift circuit that maintains the phase of the signal from said inverter at substantially 180° with respect to the phase of the signals having a frequency in the undesired frequency spectrum.

9. A multiple frequency notch filter network as recited in claim 8 wherein said phase shift circuit comprises:
   A) a first voltage-controlled quadrature hybrid-resonator network intermediate said bandpass filter and said inverter,
   B) a second voltage-controlled quadrature hybrid-resonator network intermediate said inverter and said second mixer, and
   C) a phase shift controller for establishing a voltage for each of said first and second networks.

10. A multiple frequency notch filter network as recited in claim 8 wherein the local oscillator has a maximum frequency and said second mixer generates sum and difference frequencies, said notch filter path additionally comprising a low-pass filter intermediate said second mixer and said combiner having a cutoff frequency greater than the frequency of the local oscillator.

11. A multiple frequency notch filter network as recited in claim 6 additionally comprising a phase shift circuit that maintains the phase of the signal from said inverter at substantially 180° with respect to the phase of the signals having a frequency in the undesired frequency spectrum.

12. A multiple frequency notch filter network as recited in claim 11 wherein phase shift circuit comprises:
   A) a first voltage-controlled quadrature hybrid-resonator network intermediate said bandpass filter and said inverter,
   B) a second voltage-controlled quadrature hybrid-resonator network intermediate said inverter and said second mixer, and
   C) a phase shift controller for establishing a voltage for each of said first and second networks.

13. A multiple frequency notch filter circuit for attenuating the magnitudes of signals in undesired RF spectra in an incoming RF signal including signals at desired and the undesired RF spectra, said notch filter circuit comprising:
   A) input terminal means for receiving the incoming RF signal and output terminal means for generating a filtered RF signal,
   B) a notch filter path for signals in each undesired RF spectrum, each said notch filter path being connected to said input terminal means and including:
      i) a passive RF bandpass filter means connected to said input terminal means for receiving the incoming RF signal, each bandpass filter means having a passband corresponding to the width of the undesired RF spectrum and a center frequency corresponding to the center frequency of the undesired RF spectrum,
      ii) an inverter for shifting the phase of the output of said bandpass filter means substantially 180°, and
   C) a combiner connected to the output terminal means for receiving signals from said input terminal means and each of said notch filter paths in parallel thereby to produce the filtered signal at said output terminal means.

14. A multiple frequency notch filter circuit as recited in claim 13 wherein a said bandpass filter means in a notch filter path includes
   i) a passive bandpass filter having a constant center frequency and a passband having a width corresponding to the width of an undesired spectrum,
   ii) a variable local oscillator for generating a local oscillator signal,
   iii) a first frequency mixer for mixing the local oscillator frequency and the input signal for generating a sum signal having a frequency that translates signals in the undesired RF spectrum to the passband of said bandpass filter, and
   iv) a second frequency mixer for mixing the local oscillator frequency with the signal from said inverter for application to said combiner thereby to produce an output signal with RF spectra that can attenuate an undesired RF spectra by variation of a local oscillator frequency.

15. A multiple frequency notch filter circuit as recited in claim 14 wherein said inverter comprises a phase shift circuit that maintains the phase of the inverter output at substantially 180° with respect to the phase of signals having a frequency in the undesired RF spectrum.

16. A multiple frequency notch filter circuit as recited in claim 15 wherein said second mixer generates sum and difference frequencies, said notch filter additionally comprising a low-pass filter intermediate said second mixer and said combiner having a passband including the range of different frequencies obtained from said second mixer.

17. A multiple frequency notch filter circuit as recited in claim 16 wherein said phase shift circuit comprises:

A) a first voltage-controlled quadrature hybrid-resonator network intermediate said bandpass filter and said inverter, B) a second voltage-controlled quadrature hybrid-resonator network intermediate said inverter and said second mixer, and C) a phase shift controller for establishing a voltage for each of said first and second networks.

18. A notch filter for attenuating at least one undesired frequency spectrum in an input signal including desired and undesired frequency spectra, said notch filter comprising:

A) a bandpass filter having a fixed center frequency and a passband that corresponds to the width of the undesired frequency spectrum, B) a local oscillator, C) a first mixer for combining the input signal and the local oscillator frequency thereby to translate the frequency of signals in the undesired frequency spectrum to the passband of said bandpass filter, D) an inverter that generates an inverted output or response to the output from said bandpass filter, E) a second mixer for combining the signals from said inverter and the local oscillator thereby to translate the inverted output to the original frequency of the undesired frequency spectrum, and F) a signal combiner for combining the input signal and the output from said second mixer to produce an output signal in which signals at the undesired frequency spectra are attenuated.

19. A notch filter as recited in claim 18 wherein said notch filter additionally includes a low pass filter intermediate said second mixer and said combiner having a cutoff frequency greater than the local oscillator frequency for filtering the output of said second mixer.

20. A notch filter as recited in claim 18 wherein said local oscillator includes a frequency control circuit whereby variation of the local oscillator frequency alters the translation of the input.

* * * * *